(12) United States Patent
Tanoue et al.

(10) Patent No.: US 6,775,525 B1
(45) Date of Patent: Aug. 10, 2004

(54) RADIO COMMUNICATION APPARATUS AND SEMICONDUCTOR DEVICE

(75) Inventors: Tomonori Tanoue, Machida (JP); Kiichi Yamashita, Tsukui-gun (JP)

(73) Assignee: Renesas Technology Corporation, Tokyo (JP)

( * ) Notice: Subject to any disclaimer, the term of this patent is extended or adjusted under 35 U.S.C. 154(b) by 438 days.

(21) Appl. No.: 09/697,210

(22) Filed: Oct. 26, 2000

(30) Foreign Application Priority Data

Oct. 29, 1999 (JP) .......................................... 11-309945

(51) Int. Cl.[7] .............................................. H01Q 11/12
(52) U.S. Cl. ............................... 455/127.3; 455/127.1; 455/253.2
(58) Field of Search ............................... 455/127, 572, 455/550, 575, 341, 252.2, 253.2, 232.1, 90, 73, 80, 127.1, 127.3, 575.1, 550.1; 257/197, 580, 582, 198, 539, 540–543, 592, 723; 330/289, 295, 255, 296, 307, 275, 103, 277, 298, 149, 284, 51, 297; 361/106, 103; 219/251

(56) References Cited

U.S. PATENT DOCUMENTS

| | | | | |
|---|---|---|---|---|
| 4,963,833 A | * | 10/1990 | Mountz ........................ | 330/65 |
| 5,249,141 A | * | 9/1993 | Vandebroek et al. ......... | 364/557 |
| 5,321,279 A | * | 6/1994 | Khatibzadeh et al. ........ | 257/197 |
| 5,629,648 A | * | 5/1997 | Pratt .............................. | 330/289 |
| 5,760,457 A | * | 6/1998 | Mitsui et al. ................. | 257/582 |
| 5,880,638 A | * | 3/1999 | Schaffer ........................ | 330/255 |
| 6,043,714 A | * | 3/2000 | Yamamoto et al. ........... | 330/296 |
| 6,054,898 A | * | 4/2000 | Okuma et al. ................ | 330/266 |
| 6,054,900 A | * | 4/2000 | Ishida et al. .................. | 330/286 |
| 6,075,995 A | * | 6/2000 | Jensen .......................... | 455/550 |
| 6,204,731 B1 | * | 3/2001 | Jiang et al. ................... | 330/310 |
| 6,232,840 B1 | * | 5/2001 | Teeter et al. .................. | 330/295 |
| 6,329,809 B1 | * | 12/2001 | Dening et al. ................ | 324/95 |
| 6,678,513 B2 | * | 1/2004 | Glasbrener et al. .......... | 455/341 |

FOREIGN PATENT DOCUMENTS

JP          7-94975          4/1995

\* cited by examiner

*Primary Examiner*—Edward F. Urban
*Assistant Examiner*—C. Chow
(74) *Attorney, Agent, or Firm*—Kenyon & Kenyon

(57) ABSTRACT

A radio communication apparatus including at the transmitter-side output stage a high-frequency power amplifier module that has incorporated therein a single-stage amplifier using one multi-finger type heterojunction bipolar transistor (HBT) or a multi-stage amplifier using a plurality of HBTs sequentially connected in cascade, and at the output end an antenna connected to the high-frequency power amplifier module, wherein first capacitors and first resistors are inserted in series between the input terminal of the high-frequency power amplifier module and the control fingers of the HBT, and second resistors are inserted between the control terminal of the high-frequency power amplifier module and the control fingers of the HBT and connected to the nodes of the first resistors and the first capacitors.

23 Claims, 13 Drawing Sheets

Tip Condenser    Wiring
Tip Inductor

RADIO COMMUNICATION APPARATUS AND SEMICONDUCTOR DEVICE

BACKGROUND OF THE INVENTION

The present invention generally relates to radio communication apparatus such as cellular phones, and semiconductor devices incorporated in the radio communication apparatus, and particularly to a radio communication apparatus in which a high-frequency power amplifier module of a single-stage arrangement using a single high-power amplifier that has a plurality of transistors connected in parallel or of a multi-stage arrangement using a plurality of such high-power amplifiers of cascade connection is provided at the transmitter-side output stage, and in which an antenna is provided to be connected to this high-frequency power amplifier module, so that prevention of thermal runaway, improvement of efficiency and prevention of oscillation can be achieved.

The mobile communication apparatus (radio communication apparatus) such as car phone and cell phone has a high-frequency power amplifier module (high-frequency power amplifier circuits) built in its transmitter-side output stage. The output (transmission power) of this high-frequency power amplifier module is automatically controlled by a bias controlling circuit (APC: Automatic Power Control).

In general, a system for portable telephone is constructed in which the output from a cellular phone is changed to conform to the surrounding environment according to a power level indicating signal transmitted from a base station, thereby preventing the cross talk to or from other cellular phones. In the cellular phone, its bias control circuit supplies a certain signal (control signal) according to the received power level indicating signal to the high-frequency power amplifier module, thereby making the output from the radio communication apparatus be adjusted.

The high-frequency power amplifier module is of a single stage arrangement using a single semiconductor amplifier element (transistor) or of a multi-stage arrangement using a plurality of such transistors connected in cascade. The transistors used are bipolar transistors, MOS FET (Metal Oxide Semiconductor Field-Effect-Transistor), GaAs-MES (Metal-Semiconductor) FET, HEMT (High Electron Mobility Transistor), and HBT (Heterojunction Bipolar transistor).

U.S. Pat. No. 5,629,648 (issued May 13, 1997) discloses a high power amplifier circuit using a heterojunction bipolar transistor. This document describes that a high power bipolar transistor circuit can suppress the thermal runaway by providing a resistor for DC bias and a capacitor for AC signal at the base of each of a plurality of transistors connected in parallel, and by the DC voltage drop across the resistor.

In JP-A-7-7014 laid open Jan. 10, 1995 (corresponding to U.S. Pat. No. 5,321,279 issued Jun. 14, 1994) as another example of the prior art, it is described that a power HBT can suppress the thermal runaway (current hogging: hot-spot) by connecting a ballast high impedance to the base fingers of a Si bipolar transistor of multi-finger structure having emitter fingers (emitter terminals), base fingers (base terminals) and collector fingers (collector terminals) in order that the apparatus can be operated with high reliability. That is, the hot-spot formation due to current concentration can be suppressed by providing a ballast impedance (resistor) at each base finger.

In this document, a capacitor (bypass capacitor) is also connected in parallel to the ballast impedance (resistor) in order to assure the minimum gain loss of transistor. It is also described that the power HBT mentioned above can make a high power amplifier and can be used for cellular phone.

In addition, JP-A-7-94975 (laid open Apr. 7, 1995) discloses a high-frequency HIC module (high-frequency power amplifier module) of three-stage configuration having cascade-connected MOS FETs. This high-frequency HIC module is constructed to have a first bias circuit that biases the gate of a certain one of a plurality of MOS FETs according to the output control voltage, a second bias circuit that biases the gates of the other MOS FETs than the certain one on the basis of a fixed power source, and switching means that switches the paths of the fixed power source and the second biasing circuit on the basis of the output control voltage. This module thus increases the controllability of the output, and improves the efficiency. In addition, each biasing circuit is formed of three resistors and one capacitor.

SUMMARY OF THE INVENTION

The HBT is being used as a semiconductor amplifying element of a high-frequency power amplifier module incorporated in a radio communication apparatus such as a cellular phone because it has excellent characteristics of high speed and low power consumption.

The inventors examined the means for compressing both thermal runaway and oscillation phenomenon of HBT element and at the same time for improving the efficiency while they were developing a HBT power amplifier module (high-frequency power amplifier module) for cellular phone. From the examination, it was confirmed that the radio communication apparatus employing the well-known circuits caused the following drawbacks.

FIG. 18 is a schematic circuit diagram of part of a radio communication apparatus having incorporated therein a single-stage amplifier (high-frequency power amplifier module) using a single HBT of multi-finger structure. This module is the same as the circuit arrangement (conventional example 1) described in U.S. Pat. No. 5,629,648. Here, for the sake of explanation, a portion formed of an emitter terminal (emitter finger), a base terminal (base finger) and a collector terminal (collector finger) is called a transistor (unit cell), and a group of such transistors connected in parallel as a multi-finger structure transistor or multi-finger transistor. Thus, the above-mentioned HBT is one multi-finger transistor.

A high-frequency power amplifier module 1 has, as external terminals, an input terminal (RF in), an output terminal (RF out), a first voltage terminal (Vcc) serving as the collector terminal, too, a second voltage terminal (ground: GND) serving as the emitter terminal, too, and a biasing terminal (control terminal: Vapc) serving as the base terminal, too. The output terminal (RF out) is connected to an antenna 2 through a filter or the like not shown.

The HBT is a multi-finger transistor that has N transistors connected in parallel. The transistors, $Q_{1A}$~$Q_{1N}$ each has emitter terminal 5, base terminal 6 and collector terminal 7.

In this circuit arrangement, the input terminal and the control terminal are separated. Junction capacitors $C_{2A}$~$C_{2N}$ are connected between the input terminal and the base terminals 6 of the transistors $Q_{1A}$~$Q_{1N}$, and ballast resistors $R_{2A}$~$R_{2N}$ between the control terminal and the base terminals 6 of the transistors $Q_{1A}$~$Q_{1N}$.

In addition, the first voltage terminal (Vcc) and the collector terminals 7 are connected to a single inductor Lc, and the emitter terminals 5 to ground (GND). The high-frequency power amplifier module 1 also has a matching circuit 9 provided at the output side in order to match with the impedance of the antenna 2.

In this radio communication apparatus, since an AC signal is supplied through only capacitors, when the efficiency of the apparatus is raised to about 60% (corresponding to about 70% of the efficiency of the high-frequency power amplifier module), the element stability becomes poor, and oscillation phenomenon is apt to occur because of no loss in the signal paths, with the result that stable communication might be lost. In other words, the impedance viewing the external circuit at high frequencies is small, and the stabilization coefficient K becomes noticeably small, thus the transistors being unstable.

FIG. 6 shows a graph of the correlation between the stability coefficient K and collector current. In this graph, the curve indicates the stability coefficient of conventional example 1. From the curve, it will be seen that the stability coefficient K is about 0.15 relative to a collector current of 0.01 A and further decreases with the increase of collector current.

FIG. 7 shows a graph of the relation between the input power (dBm) and power added efficiency (%). In this graph, the curve indicates the power added efficiency of conventional example 1. From the curve, it will be seen that the power added efficiency reaches the maximum value of about 68.5% at an input power of about 25 dBm.

FIGS. 19 and 20 are schematic circuit diagrams of part of the radio communication apparatus that has incorporated therein a single-stage amplifier (high-frequency power amplifier module) using one HBT of multi-finger structure. Those circuit arrangements are the same as the circuit arrangement described in U.S. Pat. No. 5,321,279 given above. In the circuit arrangement of FIG. 19, ballast resistors $R_{1A} \sim R_{1N}$ are simply connected between the control terminal (Vapc) and the base terminals 6 of transistors $Q_{1A} \sim Q_{1N}$. However, there is a fear that, if the ballast resistors have enough values for thermal runaway prevention, the high-frequency signal attenuates with the result that the amplification characteristic is remarkably deteriorated.

In the circuit arrangement (conventional example 2) of FIG. 20, bypass capacitors $C_{1A} \sim C_{1N}$ are respectively connected in parallel with resistors $R_{1A} \sim R_{1N}$ in order to prevent the high-frequency signal from attenuating. However, in order to reduce the deterioration of the performance, it is necessary that the values of the bypass capacitors be increased (for example, be about 50 pF), thus leading to a large area of the semiconductor chip in which the HBT is built. In addition, since the number of semiconductor chips that can be produced from a single semiconductor substrate (wafer) decreases, the production cost of the semiconductor chip (semiconductor element, or semiconductor device) increases. Moreover, it was found that, since the impedance viewing the external circuit decreased at high frequencies, the stability coefficient K decreased, making it easy to oscillate the circuit. The stability coefficient K, as shown in FIG. 6, is better than in the conventional example 1, but far from the stability coefficient of 1 at which oscillation is difficult to occur. The stability coefficient K relative to a collector current of 0.01~1 A ranges from about 0.5 to 0.75.

The capacitors $C_{1A} \sim C_{1N}$ connected in parallel with the resistors $R_{1A} \sim R_{1N}$ are provided to increase the high-frequency gain. However, use of large capacitance values for the gain increase effect will make it easy to oscillate. On the contrary, if the capacitance values are small, the effect to increase the high-frequency gain decreases, making the optimum design difficult.

Accordingly, it is an object of the invention to provide a radio communication apparatus in which oscillation phenomenon is difficult to occur even in a high efficiency region of the apparatus, and a semiconductor device (semiconductor element) incorporated in the radio communication apparatus.

It is another object of the invention to provide a radio communication apparatus that can suppress thermal runaway, operate at high efficiency and make it difficult to oscillate, and a semiconductor device (semiconductor element) incorporated in the radio communication apparatus.

The above objects, other objects and noble features of the invention will be apparent from the description of this specification and the accompanying drawings.

The major features of the embodiments of the invention disclosed in this application include the following features.

(1) A radio communication apparatus having a high-frequency power amplifier module in which a single-stage amplifier using one multi-finger type heterojunction bipolar transistor (HBT) or a multi-stage amplifier using a plurality of HBTs sequentially connected in cascade is incorporated, at the transmitter-side output stage, and an antenna connected to the high-frequency power amplifier module, wherein first capacitors and first resistors are inserted in series between the input terminal of the high-frequency power amplifier module and the control terminals of the HBT, and second resistors are inserted between the control terminal of the high-frequency power amplifier module and the control terminals of the HBT, and connected to the nodes of the first resistors and the first capacitors.

A semiconductor device (semiconductor element) incorporated in the radio communication apparatus includes an input terminal, an output terminal, a bias terminal, a power amplifier that has a plurality of transistors each having first and second terminals and a control terminal for controlling the current flowing between the first and second terminals, first capacitors $C_{2A} \sim C_{2N}$ inserted between the input terminal and the control terminals of the transistors, and connected to the input terminal, first resistors $R_{1A} \sim R_{1N}$ connected in series with the first capacitors $C_{2A} \sim C_{2N}$ and connected to the control terminals, and second resistors $R_{2A} \sim R_{2N}$ inserted between the bias terminal and the control terminals of the transistors, and connected to the nodes of the first resistors $R_{1A} \sim R_{1N}$ and the first capacitors $C_{2A} \sim C_{2N}$, the output terminal being connected to the first terminals of the transistors.

(2) In the arrangement of the above means (1), second capacitors are respectively connected in parallel with the first resistors. In the semiconductor device incorporated in the radio communication apparatus, the arrangement of the above means (1) also has second capacitors $C_{1A} \sim C_{1N}$ connected in parallel with the first resistors $R_{1A} \sim R_{1N}$.

(3) In the above means (1) or (2), an inductor is connected to the base terminals and/or emitter terminals of the transistors.

(4) A radio communication apparatus in which a high-frequency power amplifier module that has incorporated therein a single-stage amplifier using one multi-finger type heterojunction bipolar transistor (HBT) or a multi-stage amplifier using a plurality of HBTs sequentially connected in cascade is provided at the transmitter-side output stage, and an antenna is provided to be connected to the high-frequency power amplifier, wherein the thermal resistance difference between a plurality of terminals (fingers) of the HBT that constitutes one stage of the above amplifier is designed to be much smaller than the average thermal resistance of the fingers, first resistors are connected between the input terminal of the high-frequency power amplifier module and the control terminals of the HBT, first capacitors are connected between an input terminal of the high-frequency power amplifier module and a first node to which the first resistors are connected, and second resistors are connected between the control terminal of the high-frequency power amplifier module and the nodes of the first resistors and capacitors.

According to the above means (1), (a) since the second resistors cause a base voltage drop with the increase of base current due to the temperature rise of the HBT chip, the currents in the transistors can be suppressed from increasing, thus thermal runaway being suppressed. Therefore, the semiconductor device (semiconductor element) can have the same effect as above.

(b) The first resistors cause high-frequency signal loss to prevent the gains from excessively increasing, thus stabilizing the transistors and preventing them from oscillation. Therefore, the semiconductor device can have the same effect as above.

(c) The radio communication apparatus can achieve high efficiency by connecting the first and second resistors and the first capacitors. For example, if the high-frequency power amplifier module is constructed by HBT with about 100 transistors and with emitter size of about $2\ \mu m \times 20\ \mu m$, it can produce output of about 4 W. At this time, if the current amplification factor is about 80, efficiency of about 70% can be attained under the selection of first capacitors of about 0.15 pF, first resistors of about 100 ohms and second resistor of about 1 kilo ohms (see FIGS. 7 and 8). At the time of this high efficiency operation, the DC current flowing in the first resistors ranges from about 0.2 to 0.5 mA, and the voltage drop across the first resistors is as sufficiently small as about 20 to 50 mV, so that the loss in the first resistors is small. From FIG. 9, it will be seen that the efficiency change is relatively small up to 2.5 times the first resistors of 100 ohms, or $250\Omega$ (parallel resistance of 100 resistors is $2.5\Omega$). The voltage drop across the first resistors at this time is as sufficiently small as 50 to 25 mV. This means that the radio communication apparatus can attain a high efficiency of about 60%.

(d) Since the amplifier can be prevented from simply causing thermal runaway and oscillation due to temperature change and source voltage fluctuation, radio communication can be stably performed without interference.

(e) Although the high-frequency gain can be increased by connecting capacitors in parallel with the first resistors, increase of the capacitance value will cause oscillation. In this invention, since capacitors are not connected in parallel with the first resistors, the oscillation due to the base ballast resistors can be suppressed. Therefore, the semiconductor device has the same effect as above.

According to the means (2), (a) since the first and second resistors connected in series are connected to the base terminals, and second capacitors are connected in parallel with the first resistors, the resistance value of the first resistors can be reduced. As a result, the bypass capacitors (second capacitors) connected in parallel with the first resistors can also be reduced. The capacitance value of the bypass capacitors was about 50 pF in the prior art, but in this invention it can be reduced to about $\frac{1}{10}$ that value, or 5 pF. Thus, the chip area can be reduced the more. Therefore, the production cost of the semiconductor element (semiconductor device: semiconductor chip) can be reduced.

(b) The circuit arrangement using a combination of first resistors, second resistors, first capacitors and second capacitors can increase the circuit design freedom in the semiconductor chip. The necessity of arranging the first resistor, second resistor, first capacitor and second capacitor limits the arrangement of the elements on the chip.

In addition, the attenuation of the high-frequency signal in the first resistors can be decreased by connecting the bypass capacitors, or second capacitors in parallel therewith, so that the amplifier efficiency can be raised. For example, the same efficiency as in the conventional example 1 can be attained as shown in FIG. 7.

According to the above means (2), too, the efficiency is almost the same as in the case when the second capacitors are not provided, under the condition at which the amplifier gain is saturated, or at the point where the input power is as large as, for example, 25 dBm as shown in FIG. 7. This is because the increase of gain due to the bypassing of the high-frequency signal by the second capacitors not to produce the loss in the first resistors and the increase of the efficiency associated therewith are cancelled out by the gain saturation effect of the amplifier.

Therefore, when the gain of the amplifier in operation is saturated, use of the arrangement shown in FIG. 1, not the arrangement of the means (2), is desired by considering the difficulty of the chip design due to the complexity of arranging the elements and the increase of the chip area due to the increase of the number of elements. When the gain of the amplifier is not saturated, the means (2) can be used, and in this case the efficiency is high.

According to the means (3), connection of inductors can enable the use of negative feedback, thus leading to the stabilization of circuits.

According to the fourth means (4), (a) since the second resistors develop base voltage drop with the increase of base current due to the temperature rise of the whole multi-finger type HBT, the current in all the multi-finger HBT can be suppressed, and thus the thermal runaway can be suppressed.

(b) In addition, since the first resistors attenuate the high-frequency signal, preventing the gain from excessively increasing so that the transistors can be stabilized not to oscillate.

(c) Moreover, since the first resistors develop different base voltage drops for each finger in accordance with the base current increase difference due to the temperature rise difference among the HBT fingers (unit transistors), the collector current difference can be reduced so that each finger can be uniformly operated without current concentration in one finger.

(d) A high-efficiency and small-sized radio communication apparatus can be produced by connecting the first resistors, second resistors and first capacitors in the circuit arrangement. For example, if a high-frequency power amplifier module is constructed by HBT with about 100 transistors and with the emitter size of about $2\ \mu m \times 20\ \mu m$, it can produce output of about 4 W. At this time, if the current amplification factor is selected to be about 80, an efficiency of about 70% can be attained under the connection of the first capacitors of about 0.15 pF, first resistors of about 100 ohms, and second resistors of about 1 kilo ohms (see FIGS. 7 and 8). At the time of this high-efficiency operation, the DC current flowing in the first resistors is about 0.2 to 0.5 mA, and the voltage drop across the first resistors is as sufficiently small as 20 to 50 mV, so that the loss in those resistors is small. From FIG. 9, it will be seen that the efficiency change is relatively small up to 2.5 times the first resistors of 100 ohms, or 250Ω (parallel resistance of 100 resistors is 2.5Ω). The voltage drop across the first resistors at this time is as sufficiently small as 50 to 25 mV. This means that the radio communication apparatus can attain a high efficiency of about 60%.

(e) Only the first resistors are necessary to connect for each HBT in the element arrangement, and the second resistors and first capacitors may be provided for each block that is formed by a plurality of HBTs arranged so that thermal resistance difference can be reduced. Therefore, the freedom of arranging the elements can be increased. In addition, the decrease of the total number of resistors and capacitor elements results in the decrease of the area of the separation regions between the elements. Therefore, it is possible to design a low-cost chip (semiconductor device) with the area reduced.

DESCRIPTION OF THE EMBODIMENTS

Figure 1:
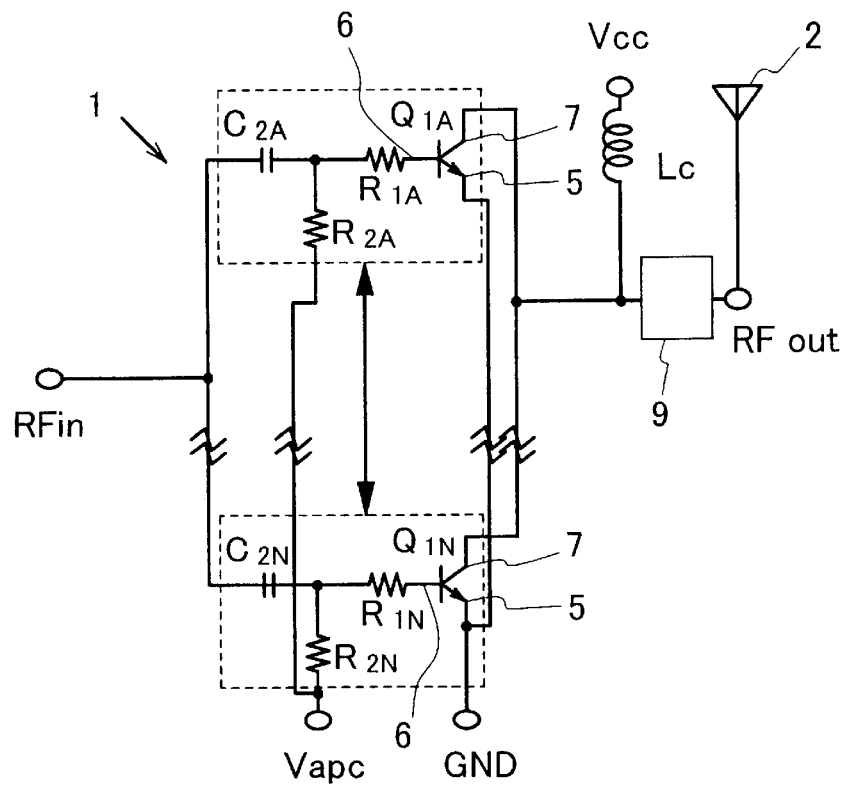
FIG. 1 is a circuit diagram showing part of a radio communication apparatus of one embodiment (embodiment 1) according to the present invention.

Embodiments of the invention will be described in detail with reference to the accompanying drawings. In all figures for explaining the embodiments of the invention, like elements are identified by the same reference numerals, and will not be described repeatedly.

(Embodiment 1)

FIGS. 1 through 9 are diagrams relating to a radio communication apparatus and semiconductor device (semiconductor element) of one embodiment according to the invention. The embodiment 1 is a semiconductor device (semiconductor chip) using a heterojunction bipolar transistor (HBT) as a semiconductor amplifying element.

Figure 2:
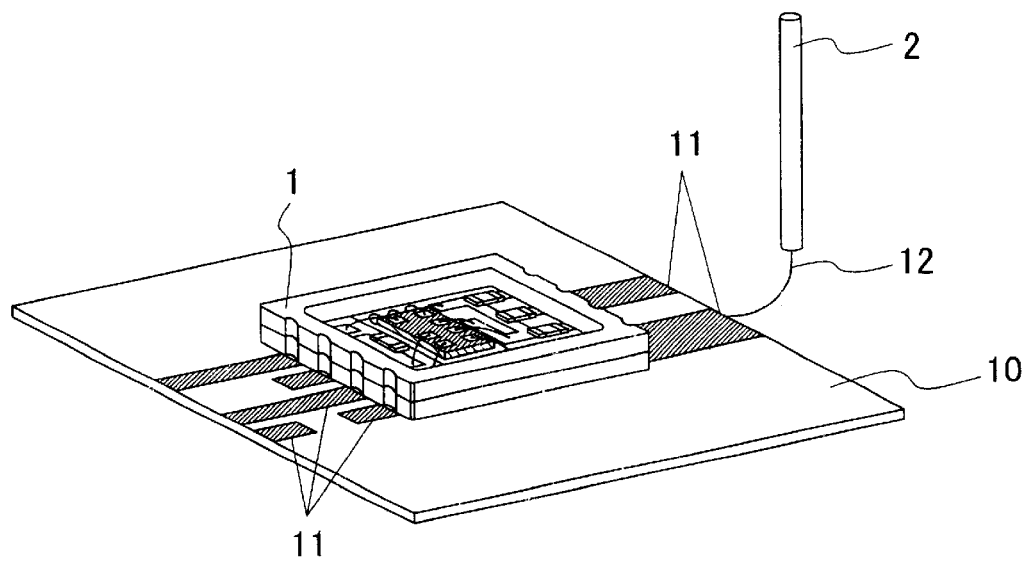
FIG. 2 is a schematic perspective view showing part of the radio communication apparatus of the embodiment 1.

FIG. 1 is a schematic circuit diagram of part of a radio communication apparatus in which a single-stage amplifier (high-frequency power amplifier module 1) using one HBT is provided at the transmitter-side output stage, and connected to the antenna 2 through a filter not shown. FIG. 2 is a schematic diagram showing the situation in which the packaged high-frequency power amplifier module 1 is mounted on a printed wiring substrate 10 of a radio communication apparatus such as a cellular phone. External terminals (electrodes) are provided on the underside of the high-frequency power amplifier module 1, and mechanically and electrically connected through a bonding material to predetermined wiring conductors 11 that are formed on the substrate 10. The wiring conductors 11 electrically connected to the output terminals of the high-frequency power amplifier module 1 are connected through a conductor 12 to the antenna 2.

The high-frequency power amplifier module 1 have, as external terminals, the input terminal (RF in), output terminal (RF out), first voltage terminal (Vcc: collector terminal), second voltage terminal (GND: emitter terminal), and the control terminal (Vapc: base terminal) for a bias terminal. The output terminal is connected through a filter not shown to the antenna 2.

The amplifier of the high-frequency power amplifier module 1 is formed of the heterojunction bipolar transistor (HBT) incorporated in a semiconductor chip (semiconductor element). This HBT is a multi-finger transistor of the type in which N transistors are connected in parallel to produce a high power amplifier. The transistors, $Q_{1A}$~$Q_{1N}$ each have emitter terminal 5, base terminal 6 and collector terminal 7. Those terminals (fingers) of each transistor $Q_{1A}$~$Q_{1N}$ are bundled up as a base terminal, an emitter terminal and a collector terminal. The collector terminal is connected through the matching circuit 9 to the output terminal (RF out). The collector electrode is connected through the inductor Lc to the first voltage terminal (Vcc: collector terminal). The inductor Lb serves to suppress a high frequency (RF) signal from leaking and thus stabilize the power source potential.

The circuit arrangement of embodiment 1 is constructed for the input terminal and bias terminal (control terminal) to be separated. The first capacitors $C_{2A} \sim C_{2N}$ as junction capacitors and the first resistors $R_{1A} \sim R_{1N}$ as ballast resistors are inserted in series between the input terminal and the base terminals 6 of transistors $Q_{1A} \sim Q_{1N}$, respectively. In addition, the second resistors $R_{2A} \sim R_{2N}$ for voltage drop are respectively inserted between the bias terminal (control terminal) and the nodes at which the first resistors $R_{1A} \sim R_{1N}$ and the first capacitors $C_{2A} \sim C_{2N}$ are connected.

The second resistors $R_{2A} \sim R_{2N}$ have larger resistance values than the first resistors $R_{1A} \sim R_{1N}$. The reason for this is that if the temperature of the semiconductor chip rises to increase the current flowing in the HBT, the voltage drop due to the current increase can suppress the thermal runaway of HBT. In order to suppress this thermal runaway, the resistance values of the second resistors $R_{2A} \sim R_{2N}$ are, for example, made about 10 times larger than those of the first resistors $R_{1A} \sim R_{1N}$. The insertion of the second resistors $R_{2A} \sim R_{2N}$ enables the first resistors $R_{1A} \sim R_{1N}$ to be reduced in their resistance values.

The multi-finger type HBT has, for example, the emitter made of InGaP and the base and collector made of GaAs.

Figure 3:
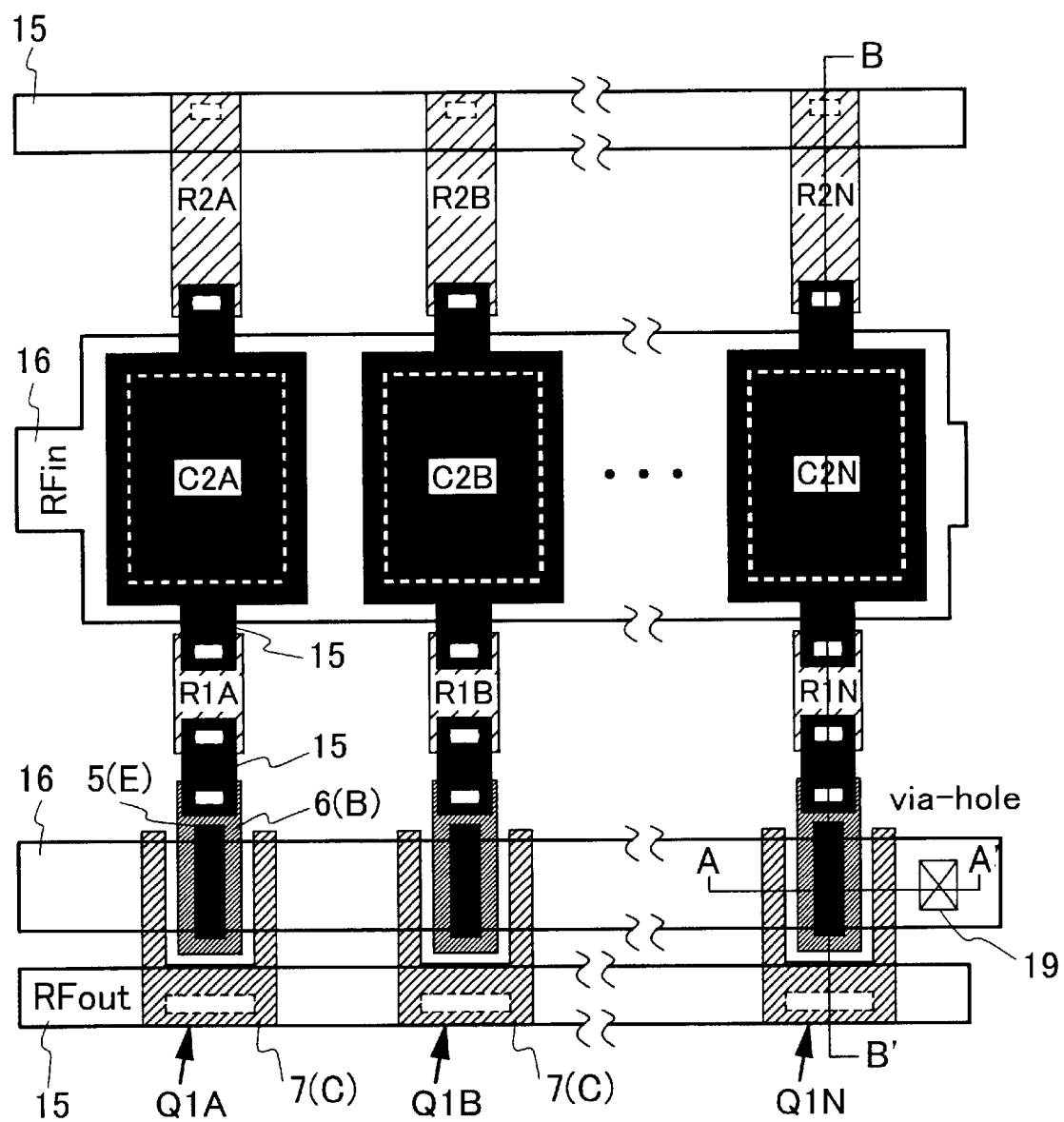
FIG. 3 is a schematic plan view showing part of a semiconductor chip (semiconductor device) that is incorporated in the radio communication apparatus of the embodiment 1 and that has formed therein an amplifier including an HBT of multi-finger structure, first capacitors, first resistors and second resistors.
Figure 4:
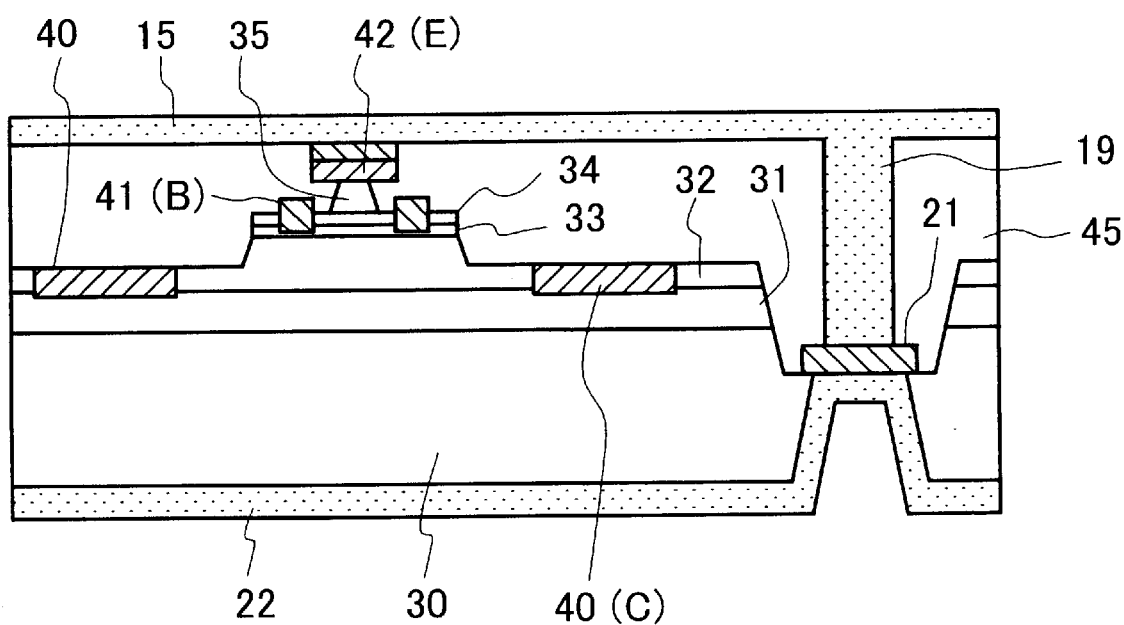
FIG. 4 is a cross-sectional view taken along a line A–A' in FIG. 3.
Figure 5:
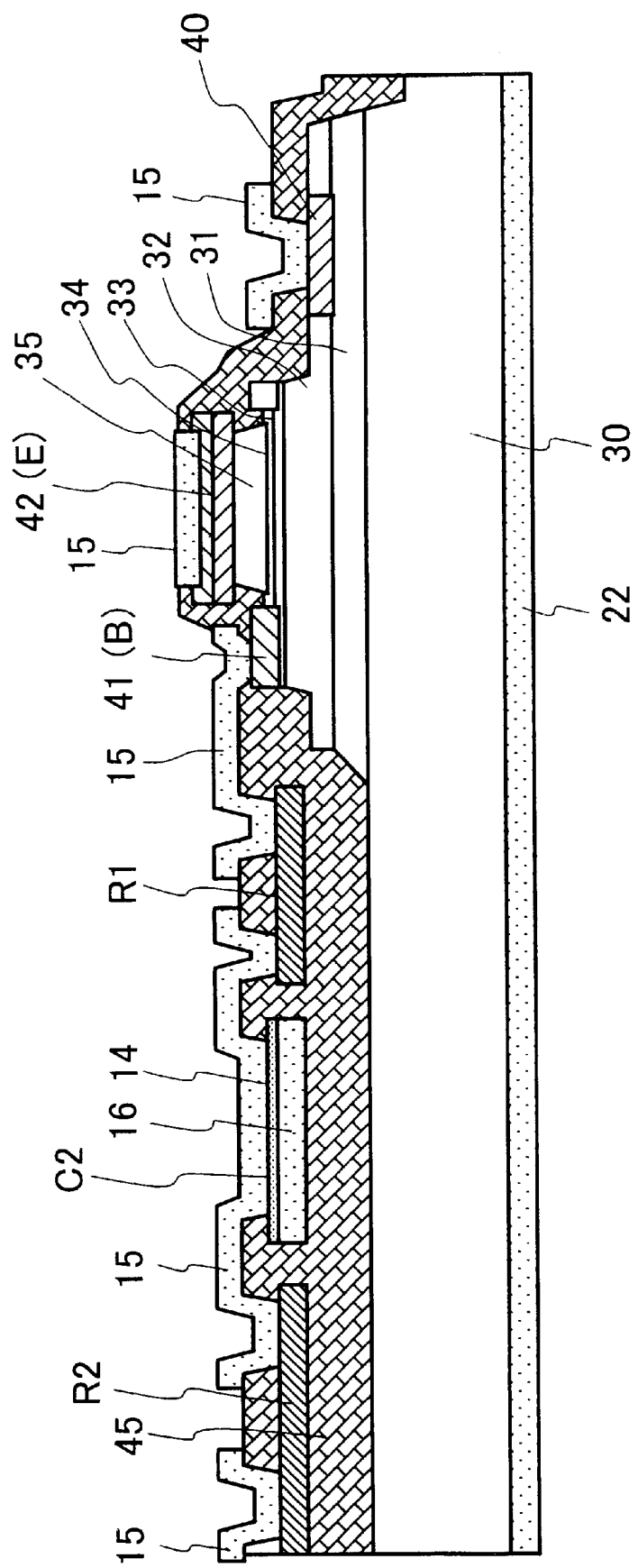
FIG. 5 is a cross-sectional view taken along a line B–B' in FIG. 3.

FIG. 3 is a schematic plan view of part of the semiconductor element (semiconductor chip) in which the amplifier including HBT that corresponds to the circuit arrangement of FIG. 1 is constructed. FIG. 4 is a cross-sectional view taken along the line A–A' in FIG. 3. FIG. 5 is a cross-sectional view taken along the line B–B' in FIG. 3.

As shown in FIG. 3, a plurality of first capacitors $C_{2A} \sim C_{2N}$ (also simply called capacitor $C_2$) are laterally arranged at the center. The one electrode (capacitor's underlayer metal conductor 16) of the first capacitors $C_{2A} \sim C_{2N}$ is connected to the input terminal (RF in). The other capacitor electrodes (metal conductor 15) are connected to one ends of the first resistors $R_{1A} \sim R_{1N}$ (also simply called resistor $R_1$) of the transistors. A capacitor insulating film 14 is interposed at the intersection regions between the capacitor underlayer conductor 16 and the conductors 15 so as to form the capacitor $C_2$ (see FIG. 5). The other ends of the resistor $R_1$ are connected to other independent conductors 15, which are then connected to the base terminals 6 (in FIG. 5, indicated at 41) of transistors $Q_{1A} \sim Q_{1N}$.

The collectors 7 (in FIG. 5, indicated at 40) of transistors $Q_{1A} \sim Q_{1N}$ are connected to still another independent conductor 15. This metal conductor 15 is connected to the output terminal (RF out). The emitter terminals 5 (in FIG. 5, indicated at 42) are connected to another independent metal conductor 15 (ground line). This ground line is electrically connected through a conductor 19 filled in a via-hole and an etching stopper 21 made of conductor provided thereunder to a rear-side electrode 22 (GND) provided on the rear side (underside) of the semiconductor chip (semiconductor element: semiconductor amplifying element) (see FIG. 4).

The other electrode (metal conductor 15) of the capacitor $C_2$ is connected to the one ends of the second resistors $R_{2A} \sim R_{2N}$ (also simply called resistor $R_2$). The other end of the resistor $R_2$ is connected to the other independent conductor 15. This conductor 15 is connected to the bias terminal (control terminal: base terminal). The amplifier circuit arrangement of FIG. 1 is thus constructed.

The cross-sectional structures and so on of the HBT, capacitor $C_2$, resistor $R_1$ and resistor $R_2$ will be described with reference to FIGS. 4 and 5. The semiconductor amplifying element in which the capacitor $C_2$, resistor $R_1$ and resistor $R_2$ are incorporated is monolithically formed on a semi-insulating GaAs substrate 30. The size and so on of each part particularly unnecessary to explain in this invention will not be described.

On the semi-insulating GaAs substrate 30 is formed an n+type GaAs sub-collector layer 31, and on this n+type GaAs sub-collector layer 31 is formed an n type GaAs collector layer 32. The n type GaAs collector layer 32 is selectively etched away to a halfway depth to form a partially projected mesa portion. The thin n type GaAs collector layer 32 on the outside of the mesa portion is partially etched away, and the collector electrode 40 is provided in this etched away recession.

On the top of the mesa portion are provided in turn a p+type GaAs base layer 33, an n type InGaP emitter layer 34 and n+type GaAs cap layer 35 in a superimposed manner. The p+type GaAs base layer 33, and n type InGaP emitter layer 34 are of substantially the same size and superimposed exactly, but the n+type GaAs cap layer 35 is formed in a thin rectangular shape at the center of the mesa portion.

On the mesa region out of the n+type GaAs layer 35, the n type InGaP emitter layer 34 and n+type GaAs cap layer 35 are selectively etched away to form a contact hole, and the base electrode 41 is provided in this contact hole region.

The top of the semi-insulating GaAs substrate 30 is covered with an insulating film 45 for protecting the surface. In an intermediate layer of this insulating film 45 are formed the resistor $R_1$, resistor $R_2$ and capacitor $C_2$ as illustrated in FIG. 5. If a lamination layer of $SiO_2$ and SiN is used for the capacitor's insulating film 14, the capacitor with less leak current can be formed. In addition, the area of capacitor $C_2$ can be reduced by use of a high dielectric material such as strontium titanate (STO) or barium strontium titanate (BST) or tantalum oxide ($Ta_2O_5$) as other materials of the capacitor's dielectric, thus leading to reduction of the chip area. If a high melting point metal nitride such as WN, WNSiN, TiN or TaN is used as a resistance material, highly reliable resistors can be formed. Also, NiCr alloy can be used for the resistors.

The insulating film 45 is partially etched away to form contact holes, and the wiring metal conductor 15 patterned is electrically connected through the holes to the electrodes of HBT, and electrodes of resistors $R_1$, $R_2$ and capacitor $C_2$. Before the top insulating film is formed, the emitter electrode 42 (double layer as shown in FIG. 5) is deposited on the n+type GaAs cap layer 35. Then, when the conductor 15 is formed after the provision of the contact holes, the conductor 15 is connected to the emitter electrode 42, base electrode 41, collector electrode 40, and the electrodes of capacitors and resistors, thus the circuit arrangement shown in FIG. 1 being constructed.

The number of transistors $Q_{1A} \sim Q_{1N}$ of HBT in this embodiment is, for example, 100 (N=100). The emitter size is, for example, about $2 \mu m \times 20 \mu m$, the current amplification factor is about 80, the first capacitors $C_{2A} \sim C_{2N}$ have about 0.15 pF, the first resistors $R_{1A} \sim R_{1N}$ have about 100 ohms, and the second resistors $R_{2A} \sim R_{2N}$ have about 1 kilo ohms. In this arrangement, the output from the high-frequency power amplifier module 1 is about 4 W. In this case, the efficiency of the high-frequency power amplifier module 1 is about 70%, and as a result the efficiency of the radio communication apparatus is as high as about 60%.

Figure 6:
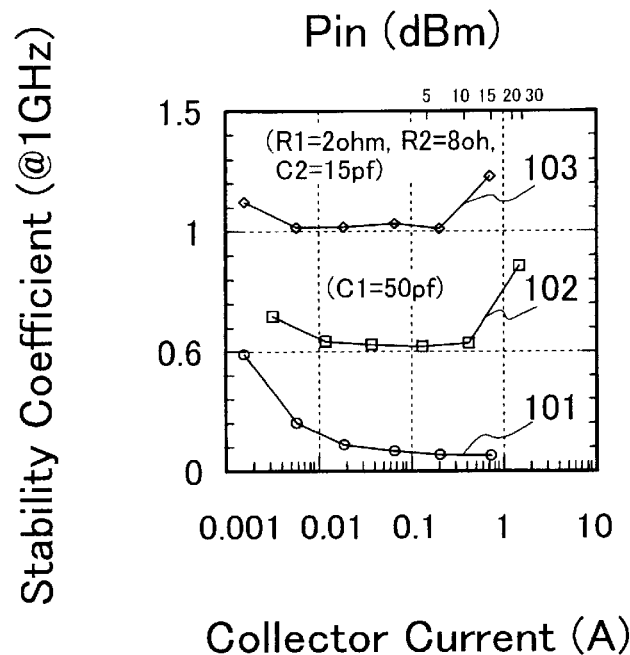
FIG. 6 is a graph showing the correlation between collector current and stability coefficient K.
Figure 7:
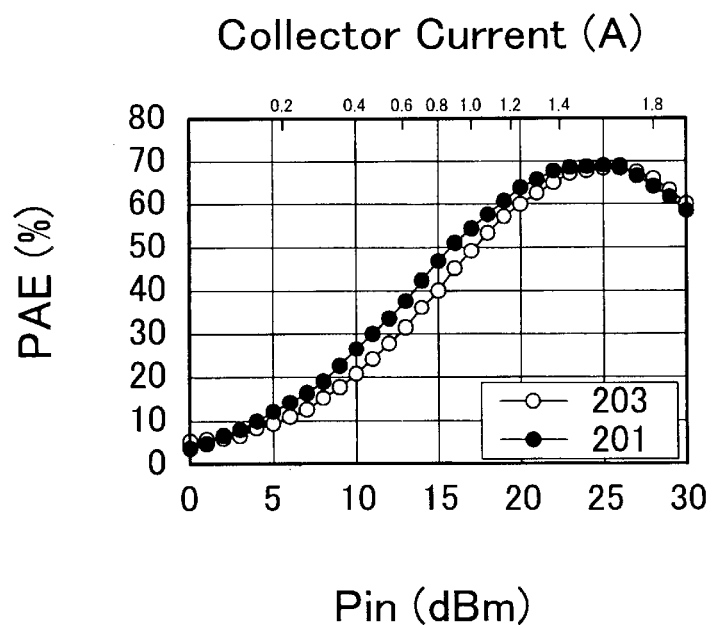
FIG. 7 is a graph showing the correlation among the input power, collector current and power added efficiency.

FIG. 6 is a graph showing the change of the stability coefficient relative to collector current in the circuit arrangements of this embodiment (invention), conventional example 1 and conventional example 2. FIG. 7 is a graph showing the correlation of the power added efficiency (PAE) to the input power and collector current in the circuit arrangements of the invention and conventional example 1.

Figure 8:
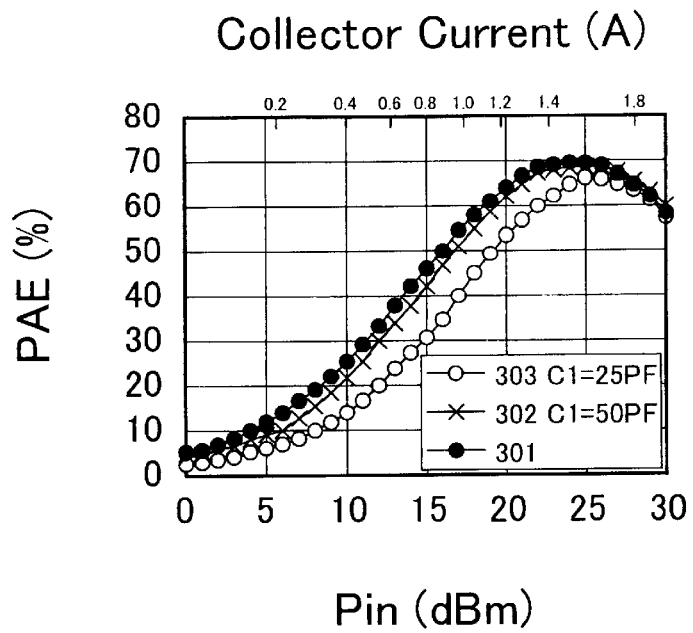
FIG. 8 is a graph showing the correlation among the input power (Pin), collector current and power added efficiency (PAE).
Figure 9:
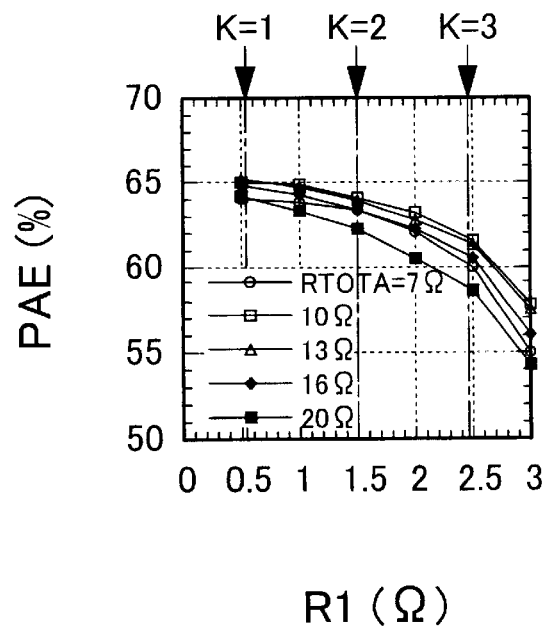
FIG. 9 is a graph showing the correlation among the first resistor R1, stability coefficient K and power added efficiency (PAE) with the total resistance (Rtotal) of the first and second resistors used as a parameter.

FIG. 8 is a graph showing the correlation of the power added efficiency to the input power and collector current in the circuit arrangements of the conventional example 1 and conventional example 2. FIG. 9 is a graph showing the correlation of the power added efficiency to the first resistor $R_1$ and stability coefficient K with the total resistance (Rtotal) of the first and second resistors changed in the circuit arrangement of this embodiment 1. These data of the circuit arrangements were obtained when the efficiency of the high-frequency power amplifier module is as high as about 70%, or when the efficiency of the radio communication apparatus is about 60%.

From the graph of FIG. 6, it will be seen that the stability coefficient K in the conventional example 1 is lower than 0.5, thus oscillation phenomenon being easy to occur. Even in the conventional example 2 in which the capacitors $C_{1A} \sim C_{1N}$ are connected in parallel with the resistors $R_{1A} \sim R_{1N}$, the stability coefficient K is about 0.5 relative to about 0.01 A~0.04 A of collector current, and the stability coefficient K is less than at most 0.9 even when the collector current is about 1.5 A, thus there being the possibility of oscillation.

Moreover, in the circuit arrangement of conventional example 2, the capacitors $C_{1A} \sim C_{1N}$ connected in parallel with resistors $R_{1A} \sim R_{1N}$ have as large as about 50 pF and thus have a large area, so that the semiconductor chip (semiconductor device) having HBT, resistors and capacitors incorporated becomes large in size.

FIG. 8 is a graph showing the comparison of power added efficiency among the conventional example 1 and conventional examples 2 using capacitors $C_{1A} \sim C_{1N}$ of 25 pF and 50 pF. When the capacitors $C_{1A} \sim C_{1N}$ have a capacitance value of 25 pF, the power added efficiency is so decreased that they cannot be used.

FIG. 7 shows PAE curves of the embodiment 1 (this invention) and conventional example 1. When the input power is equal to or less than 23 dBm, the power added efficiency (PAE) of the conventional example 1 is somewhat better than the invention, but when the input power is about 25 dBm, the PAE of the invention is as high as about 70% of conventional example 1. If the input power is selected to be 25 dBm, the output power can be made to be 35 dBm.

FIG. 9 is a graph showing the PAE of this embodiment 1 relative to 0.5Ω~3Ω of resistor $R_1$, or the resistance of 100 first resistors connected in parallel, with Rtotal changed as 7Ω, 10Ω, 13Ω, 16Ω, 20Ω in which case the Rtotal is the total resistance of 100 series of first and second resistors.

In order not to cause any oscillation phenomenon, it is necessary to keep the stability coefficient K 1 or above. If the stability coefficient is selected to be 1, the PAE can be increased to about 64% even if the Rtotal is 7Ω, 10Ω, 13Ω, 16Ω or 20Ω. Even when the stability coefficient K is selected to be 2, the PAE can be kept as high as about 63% provided that the Rtotal is less than 16Ω.

The radio communication apparatus of the embodiment 1 has the following effects when the semiconductor device (semiconductor element) according to the embodiment 1 is incorporated in this apparatus.

(1) Since the second resistor develops the base voltage drop across itself with the increase of base current due to the temperature rise of HBT chip (semiconductor device), the current in each transistor can be suppressed from being increased, so that the thermal runaway can be suppressed.

(2) The first resistor, since it causes high-frequency signal loss to prevent excessive increase of gain, can stabilize each transistor to prevent oscillation.

(3) High-efficiency radio communication apparatus can be provided by connecting the first and second resistors and the first capacitors. For example, if HBT is used in the high-frequency power amplifier module so as to have about 100 transistors with the emitter size selected to be about 2 μm×20 μm, output of about 4 W can be achieved. At this time, when the current amplification factor is selected to be about 80, efficiency of about 70% can be achieved by selecting the first capacitors of about 0.15 pF, first resistors of about 100 ohms and second resistors of about 1 kilo ohms. This results in the fact that the efficiency of the radio communication apparatus is as high as about 60%.

(4) The amplifier can be almost prevented from runaway and oscillation due to temperature change and power source voltage variation so that radio communication signal can be stably transmitted without interference.

(Embodiment 2)

Figure 10:
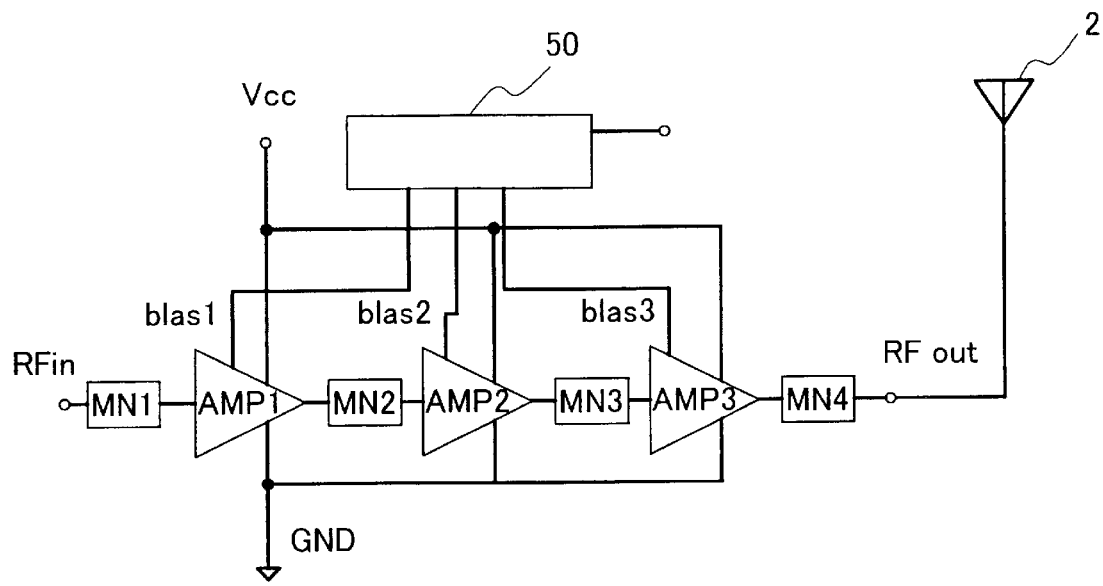
FIG. 10 is a block diagram of a high-frequency power amplifier module of multi-stage arrangement in a radio communication apparatus of another embodiment (embodiment 2) according to the present invention.
Figure 11:
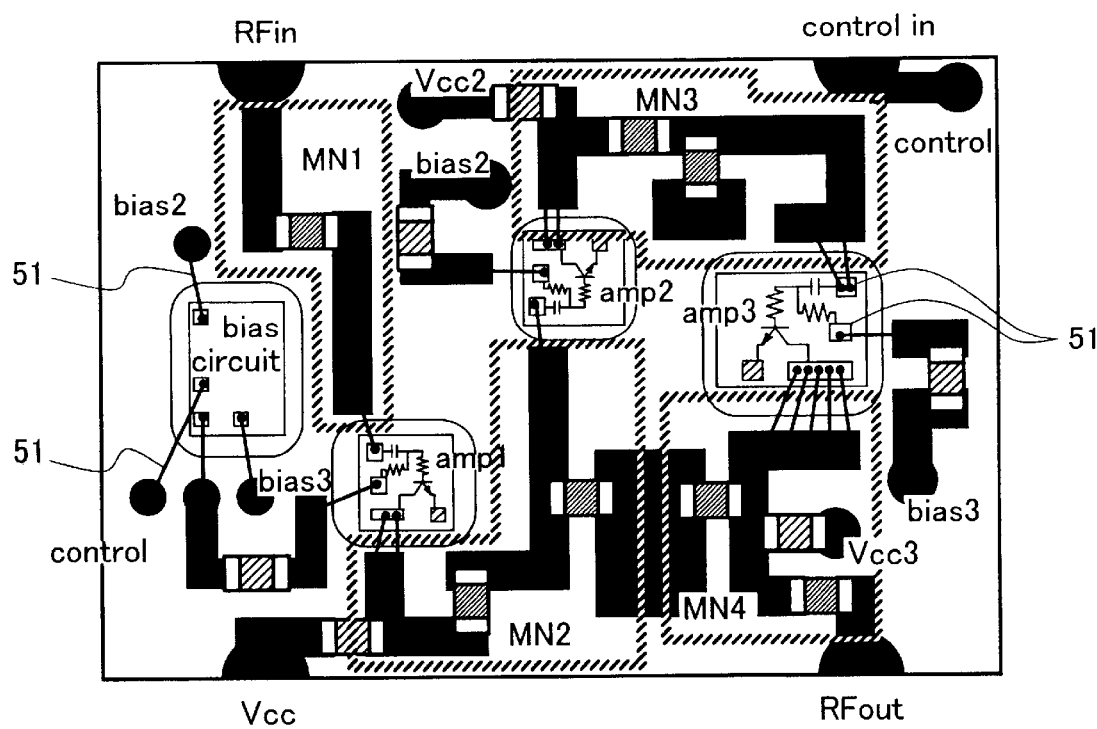
FIG. 11 is a schematic plan view showing the layout of the electronic components of the high-frequency power amplifier module according to the embodiment 2.

FIGS. 10 and 11 are diagrams of a radio communication apparatus of another embodiment (embodiment 2) of the invention. FIG. 10 is a block diagram of a high-frequency power amplifier module of multi-stage configuration, and FIG. 11 is a schematic plan view of the layout of electronic components of the high-frequency power amplifier module.

The embodiment 2 is the application of the invention to a three-stage amplifier (multi-stage amplifier) having three cascaded amplifiers (semiconductor amplifying elements), amps each including HBT, resistors and capacitors. This multi-stage amplifier is incorporated at the transmitter-side output stage of a radio communication apparatus.

The radio communication apparatus has, between the input terminal (RF in) and output terminal (RF out), an impedance matching circuit MN1, an amp 1 (first stage amplifier), an impedance matching circuit MN2, an amp 2 (intermediate stage amplifier), an impedance matching circuit MN3, an amp 3 (final stage amplifier), and an impedance matching circuit MN4 connected in series as shown in FIG. 10. To the control terminals (base terminals: bias 1, bias 2, bias 3) of the high power output amplifiers (amp 1~amp 3) are supplied output signals (control voltages: Vapc 1, Vapc 2, Vapc 3) from a base biasing circuit 50 so that the amplification factors are controlled. Each of the high power amplifiers (amp 1~amp 3) has the circuit arrangement according to the embodiment 1.

FIG. 11 shows the layout of electronic components within high-frequency power amplifier module 1. The semiconductor chips (semiconductor elements) include the bias circuit 50, and the amps 1, 2 and 3. The electrodes of semiconductor chips and wiring conductors are connected by conductive wires 51. The electrodes of chip capacitors and chip inductors are electrically connected to wiring conductors by solder not shown.

In each of the amps 1, 2 and 3, the transistor and the first and second resistors and first capacitor connected to this transistor are schematically shown.

Although the base biasing circuit 50 is not particularly described in detail in this embodiment 1, it is assumed that the base biasing circuit 50 controls each high power amplifier stage under a constant control voltage (Vapc).

The base biasing circuit 50 can control each high power amplifier stage by a predetermined control voltage as will be described later.

The radio communication apparatus having the high-frequency power amplifier modules 1 of multi-stage configuration according to the embodiment 2 has the same effect as in the embodiment 1, and in addition to that, the increase of gain, the increase of output controllability by bias control circuit and output linearity can be attained by the three-stage amplifier construction. Thus, the radio communication apparatus can provide high communication performance.

(Embodiment 3)

Figure 12:
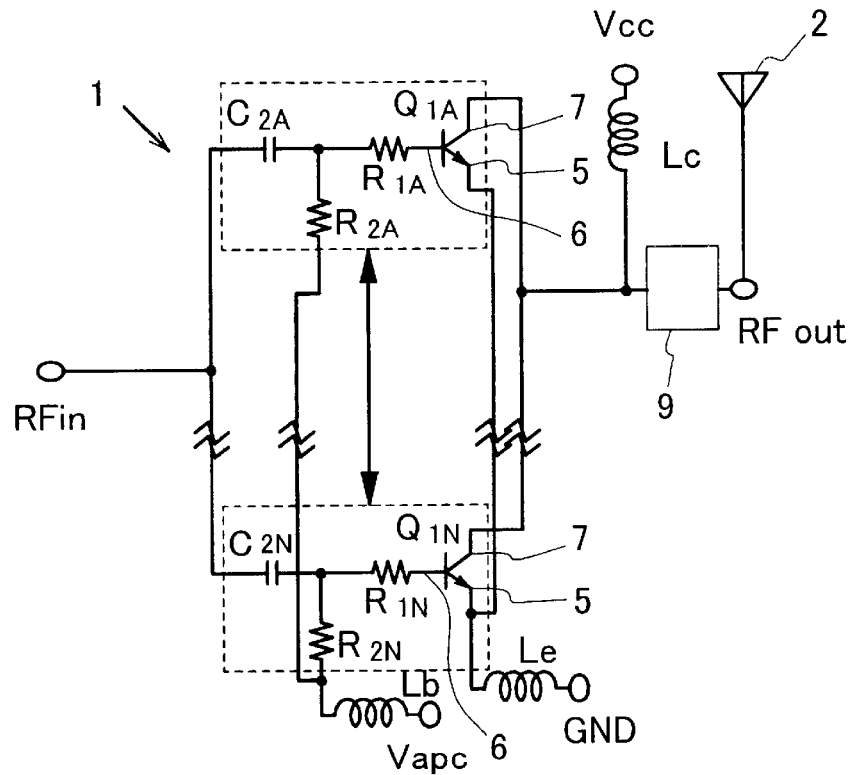
FIG. 12 is a circuit diagram showing part of a radio communication apparatus of another embodiment (embodiment 3) according to the present invention.

FIG. 12 is a circuit diagram of part of a radio communication apparatus of still another embodiment (embodiment 3) according to the invention. In this embodiment 3, an inductor Lb is added to be connected between the base terminal and the group of second resistors, and an inductor Le between the emitter and GND in the amplifier of embodiment 1. The connection of inductor Lb increases the impedance viewing the base power circuit, thereby preventing the high-frequency (RF) signal from leaking to the base power circuit so that high efficiency can be achieved by the decrease of loss due to leaking. The connection of inductor Le makes negative feedback effective, thus stabilizing the circuits. Since the inductors Lb and Le have separate effects, connection of only inductor Lb or Le will naturally provide the effect given above.

(Embodiment 4)

Figure 13:
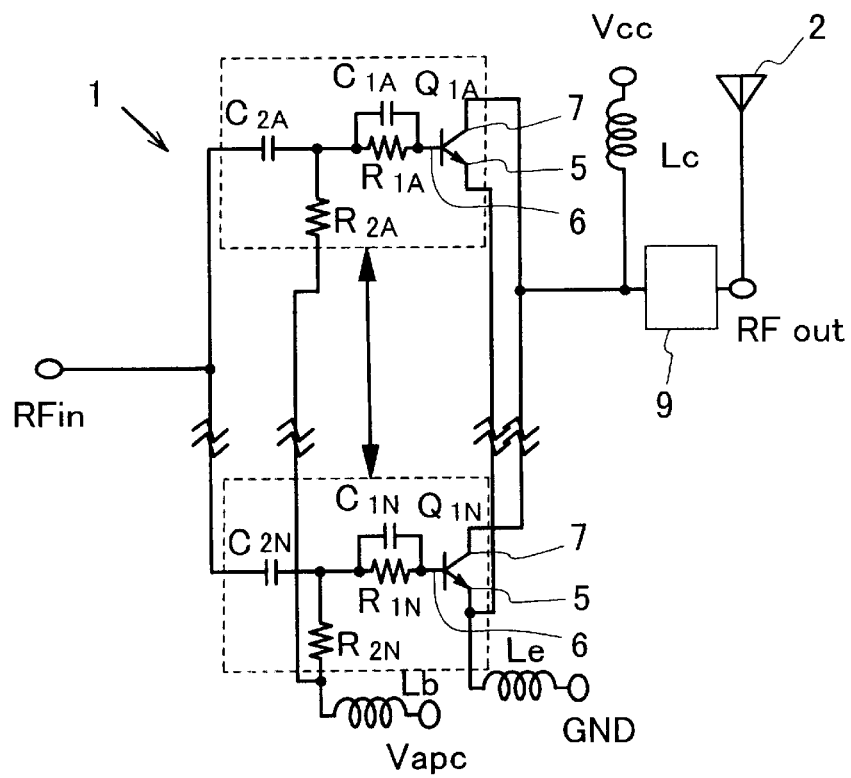
FIG. 13 is a circuit diagram showing part of a radio communication apparatus of another embodiment (embodiment 4) according to the present invention.

FIG. 13 is a circuit diagram of part of a radio communication apparatus of still another embodiment (embodiment 4) according to the invention. In this embodiment 4, bypass capacitors for high frequency component signals, or second capacitors $C_{1A} \sim C_{1N}$, are connected in parallel with the ballast resistors, or first resistors $R_{1A} \sim R_{1N}$ in the circuit arrangement of the embodiment 1. In the embodiment 4, the connection of the second resistors $R_{2A} \sim R_{2N}$ between the base terminal and base 6 makes it possible to decrease the resistance value of resistors $R_{2A} \sim R_{2N}$, and thus similarly to decrease the capacitance value of bypass capacitors, or second capacitors $C_{1A} \sim C_{1N}$. For example, since the first resistors $R_{1A} \sim R_{1N}$ can be selected to have about 100Ω, the capacitance value of second capacitors $C_{1A} \sim C_{1N}$ can be made as low as about 5 pF. Since the capacitance value of 50 pF used in the prior art can be decreased to about 1/10 of that value, or 5 pF, the chip area can be reduced. The result is that the area for the capacitance can be reduced, leading to small size of semiconductor chip and to a larger number of semiconductor chips acquired from a single semiconductor substrate (wafer). Thus, the production cost of semiconductor amplifier elements can be reduced.

In addition, the circuit arrangement using a combination of first resistors, second resistors, first capacitors and second capacitors has the effect to increase the freedom of design for semiconductor amplifying element and high-frequency power amplifier module.

Moreover, the inductor Lb increases the impedance viewing the base power circuit, suppresses the high frequency (RF) signal from leaking to the base power circuit, and thus reduces the loss due to the leak. Therefore, high efficiency can be achieved. The inductor Le makes negative feedback effective, thereby stabilizing the circuits. Therefore, high efficiency and stability can be achieved in those circuits.

Since the inductors Lb and Le have separate effects, connection of only inductor Lb or Le will naturally provide the effect given above. Moreover, if transmission lines are formed on the substrate in place of these inductors in order to provide a proper impedance viewing from each terminal, it is of course not always necessary to provide inductors.

(Embodiment 5)

Figure 14:
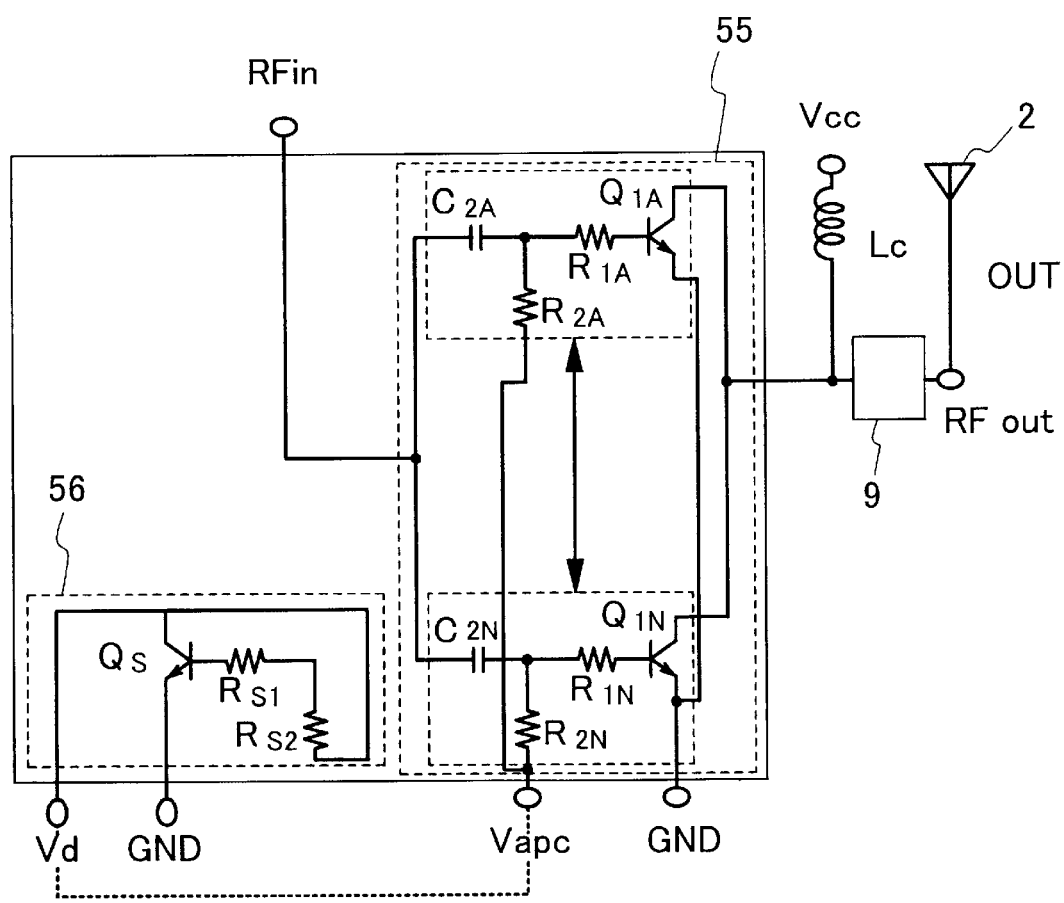
FIG. 14 is a circuit diagram showing part of a radio communication apparatus of another embodiment (embodiment 5) according to the present invention.
Figure 15:
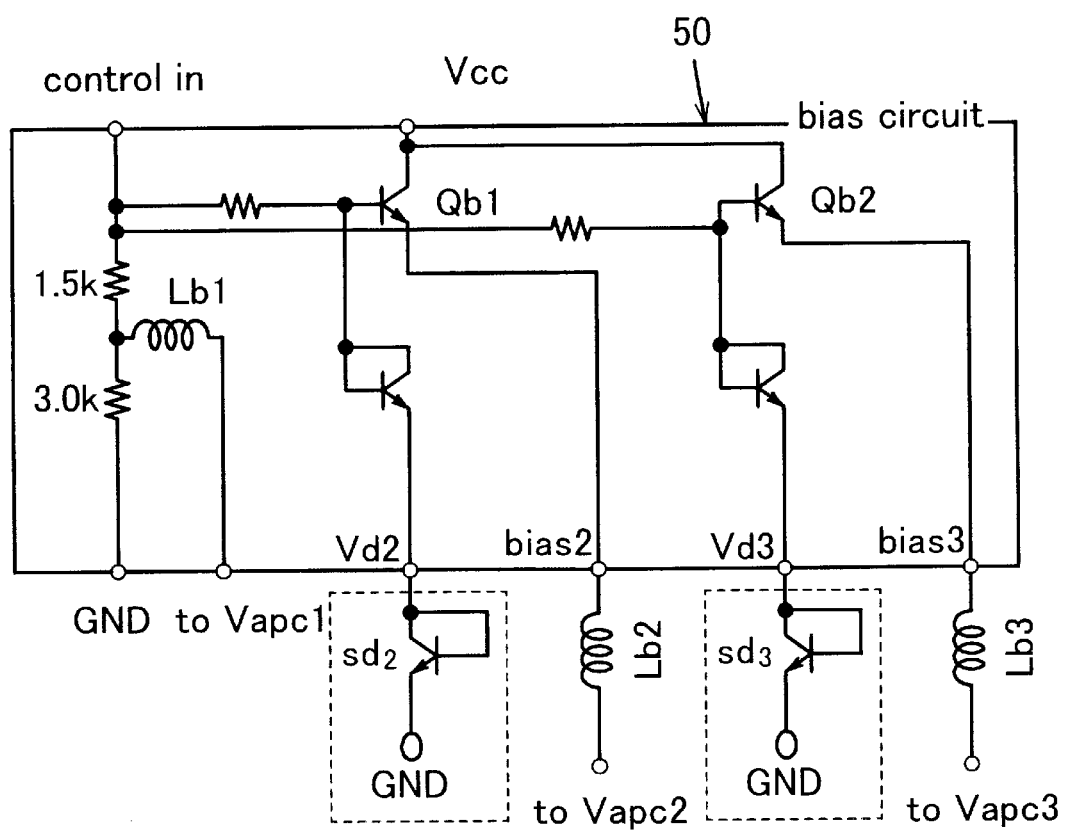
FIG. 15 is a circuit diagram of a bias control circuit of a high-frequency power amplifier module incorporated in the radio communication apparatus according to the embodiment 5.
Figure 16:
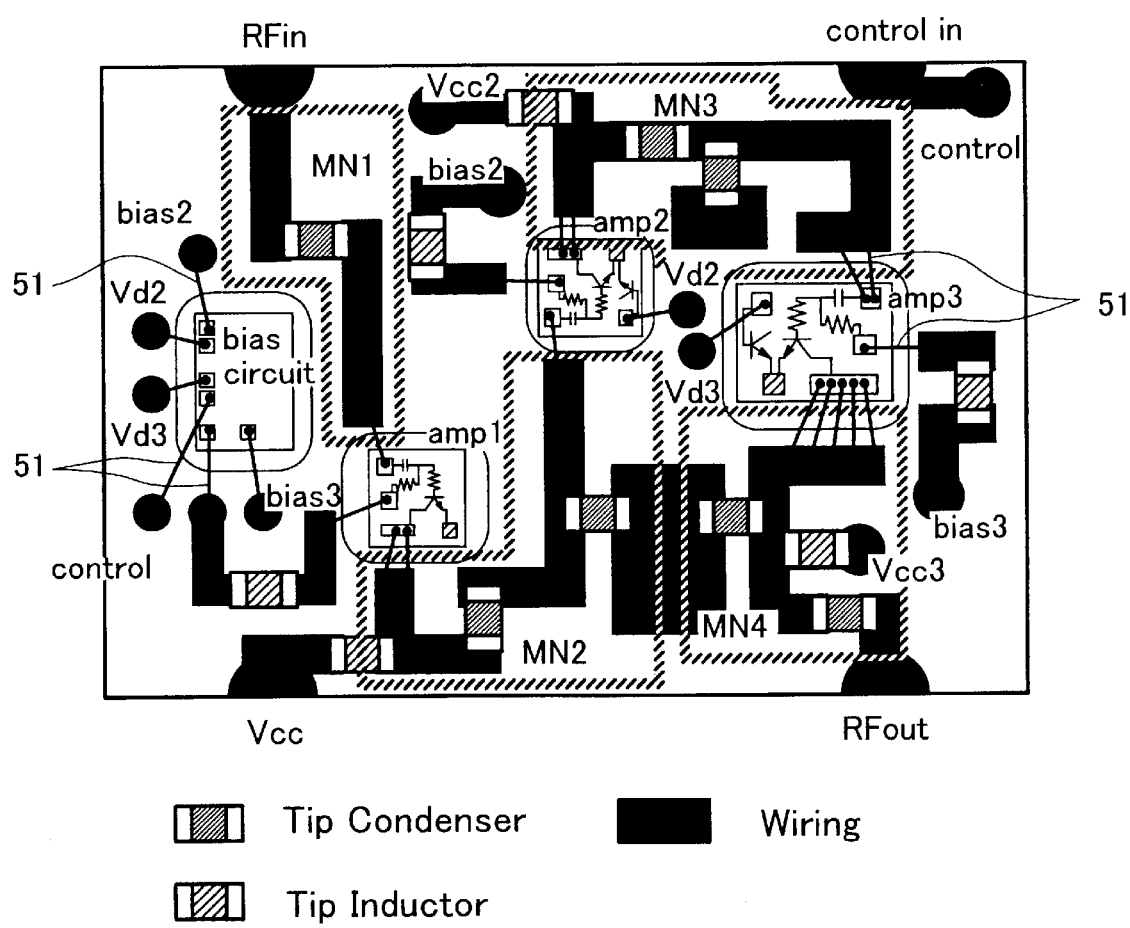
FIG. 16 is a schematic plan view showing the layout of the electronic components of the high-frequency power module according to the embodiment 5.

FIGS. 14 through 16 are diagrams of a radio communication apparatus of still another embodiment (embodiment 5) according to the invention. FIG. 14 is a circuit diagram of part of a radio communication apparatus of single-stage configuration, FIG. 15 is a circuit diagram of a bias control circuit incorporated in a high-frequency power amplifier module, and FIG. 16 is a schematic plan view showing the layout of electronic components of the high-frequency power amplifier module.

In the embodiment 5, a diode for the current-mirror (sensor diode) 56 is monolithically integrated in the same semi-insulating semiconductor substrate in which an amplifier transistor 55 is formed as shown in FIG. 14. The amplifier transistor 55 has the same circuit configuration as in the embodiment 1. That is, the first capacitors $C_{2A} \sim C_{2N}$ and first resistors $R_{1A} \sim R_{1N}$ are connected in series between the input terminal (RF in) and the base terminal 6, and the second resistors $R_{2A} \sim R_{2N}$ are connected between the control terminal (Vapc) and the nodes of the first capacitors $R_{2A} \sim R_{2N}$ and first resistors $R_{1A} \sim R_{1N}$.

The sensor diode 56 is formed of a transistor Qs of diode configuration. This transistor Qs is of HTB. For the diode configuration, a resistor Rs1 and a resistor Rs2 are connected in series between the base and collector of the transistor Qs. The collector terminal of the transistor Qs is Vd, and the emitter terminal thereof is GND.

The diode 56 for current mirror formed in the same semi-insulating semiconductor substrate has the following merit. When the temperature of the semi-insulating semiconductor substrate rises to increase the current in the transistor 55, the current flowing in the current mirror diode 56 is also increased. Therefore, by controlling the current flowing in the current mirror diode 56, it is possible to control the current flowing in the transistor 55 to be constant even if the temperature changes, thus improving the bias controllability. In other words, the sensor diode is provided on the same chip as the amplifier transistor is, and thus undergoes the same temperature change as the amplifier transistor does. The current-voltage characteristics of the base-emitter junction of the transistor and the diode have a great dependence on temperature. The transistor and the diode exhibit the same current-voltage characteristic under the same temperature. Therefore, a constant current Id is caused to flow in the sensor diode, and the base of the transistor is driven by the same voltage as the voltage drop across the diode. Then, the current flowing in the transistor can be controlled to be a constant value (Id multiplied by the junction area ratio between the sensor diode and the base-emitter junction of the amplifier transistor) irrespective of the temperature change. The sensor diode can be replaced by a sensor transistor with the same effect.

The base biasing circuit 50 in FIG. 10 is constructed to be different from the arrangement of the embodiment 2 as shown in FIG. 15. The first amp 1 is controlled by the bias (Vapc1) resulting from the division of the control in voltage by resistors Rc1 and Rc2. The intermediate and final amps 2 and 3 are controlled by the bias voltages (Vapc2, Vapc3) generated through emitter-follower transistors Qb1 and Qb2 from the control in voltage. The transistor Qs2 connected to the transistor Qb1 is the current mirror diode 56 that is monolithically formed together with the amplifier transistor 55 of amp 2. The transistor Qs3 connected to the transistor Qb2 is the current mirror diode 56 that is monolithically formed together with the amplifier transistor 55 of amp 3. The voltages from these transistors Qs2, Qs3 are used as reference voltages when the control in voltage is applied to the emitter-follower transistors Qb1, Qb2.

The inductors, Lb1~Lb3 are provided to suppress the high-frequency signal components from leaking from the control terminals (Vapc1, Vapc2, Vapc3).

In this base biasing circuit 50, a control voltage resulting from the voltage division by a resistor is applied to the control terminal Vapc1, a control current amplified at a rate of the amplification factor of transistor Qb1 is applied to the control terminal Vapc2, and a control current amplified at a rate of the amplification of transistor Qb2 is applied to the control terminal Vapc3.

FIG. 16 shows the layout of electronic components of the high-frequency power amplifier module 1 according to the embodiment 5. The semiconductor chip has the base biasing circuit 50, amp 1, amp 2 and amp 3. The electrodes of the semiconductor chip and predetermined wiring conductors are connected by conductive wires 51. The electrodes of the chip capacitors and chip inductors are electrically connected to predetermined wiring conductors by solder not shown.

In the amps 1, 2 and 3, the transistors and the first and second resistors and first capacitors connected to the transistors are schematically shown. Also in the amps 1, 2 and 3, diodes for current mirror are shown without reference numerals. The resistors Rs1, Rs2 are not shown in the current-mirror diode 56.

(Embodiment 6)

Figure 17:
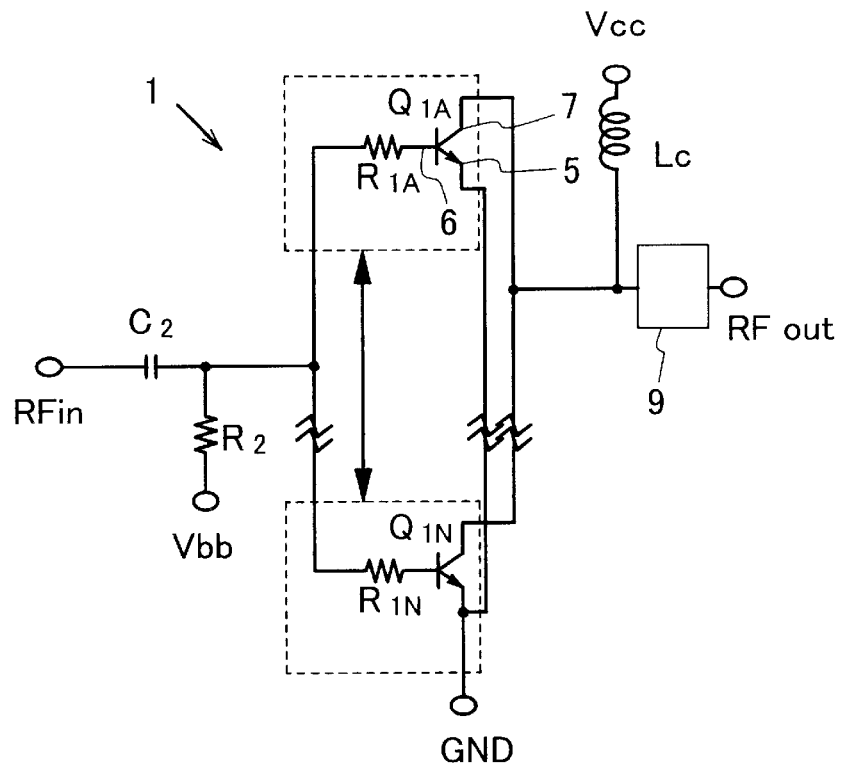
FIG. 17 is a circuit diagram showing part of another embodiment (embodiment 6) according to the present invention.
Figure 18:
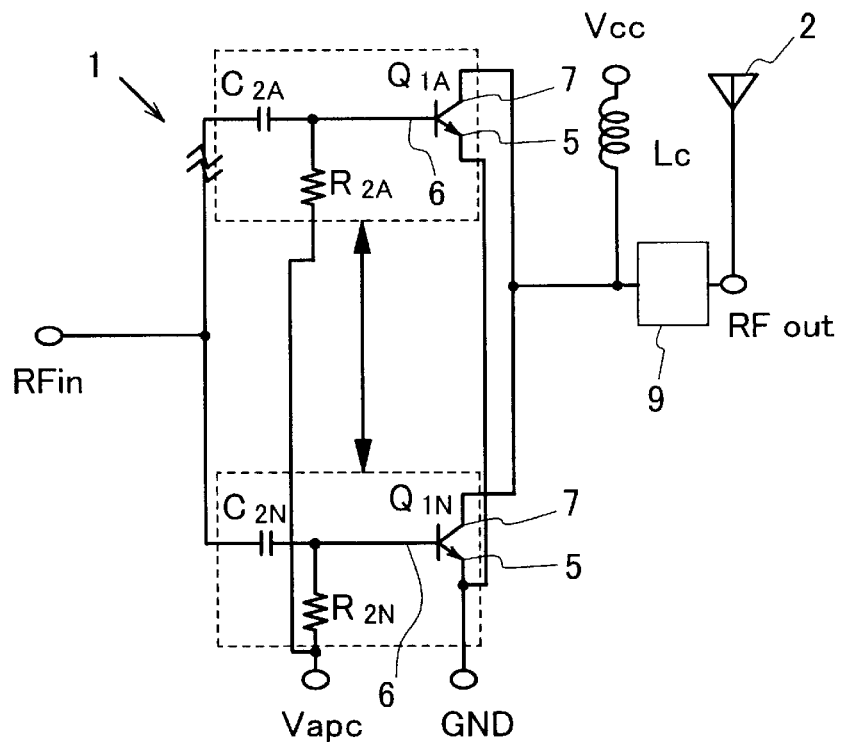
FIG. 18 is a circuit diagram showing part of a radio communication apparatus employing conventional circuits.
Figure 19:
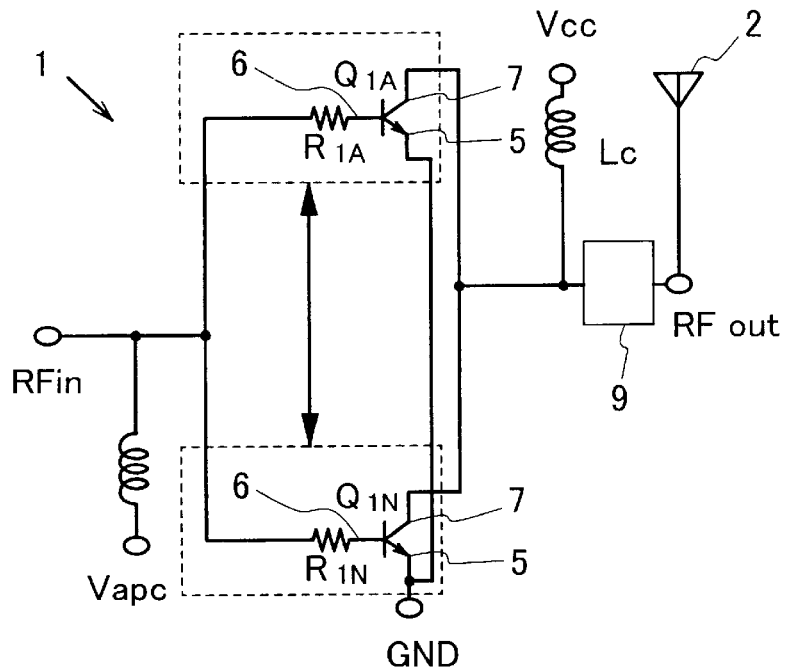
FIG. 19 is a circuit diagram showing part of a radio communication apparatus employing conventional circuits.
Figure 20:
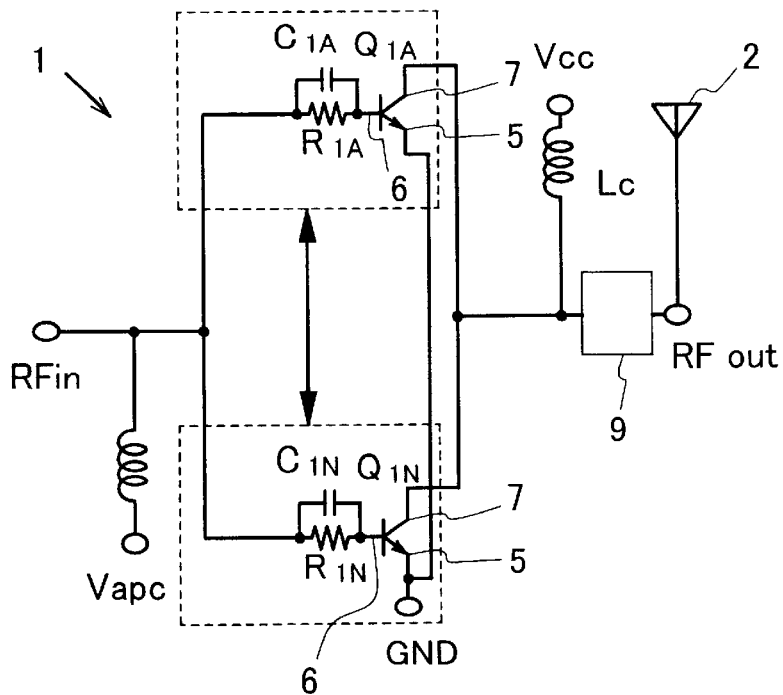
FIG. 20 is a circuit diagram showing part of a radio communication apparatus employing conventional circuits.

FIG. 17 is a circuit diagram of part of a radio communication apparatus of still another embodiment (embodiment 6) according to the invention. In the embodiment 6, the circuit arrangement of the embodiment 1 is modified as follows. The ballast and circuit stabilizing resistors, or first resistors $R_{1A} \sim R_{1N}$ of some (all in FIG. 17) transistors arranged for the thermal resistance difference to be decreased have one ends connected to the bases 6 of the transistors and the other ends connected together to one node. The second resistor $R_2$ as a single resistor is connected between the node and the bias terminal, and the first capacitor $C_2$ as a single capacitor between the node and the input terminal.

In the embodiment 6, (a) the resistor $R_2$ develops a base voltage drop across itself in accordance with the increase of base current due to the temperature rise of the whole multi-finger HBT, thus suppressing the multi-finger HBT from whole current increase, or the thermal runaway.

(b) The first resistors $R_{1A} \sim R_{1N}$ cause loss of high-frequency signal, thus preventing the gains from being excessively large so that the transistors can be stabilized and prevented from oscillation.

(c) The first resistors $R_{1A} \sim R_{1N}$ also develop different base voltage drops across themselves in accordance with the base current increase difference due to the temperature rise difference between the HBT fingers. Thus, the difference between collector currents can be decreased, so that all fingers can be uniformly operated without current concentration at one finger.

(d) Only the first resistors $R_{1A} \sim R_{1N}$ are respectively necessary to provide for each HBT. The resistor $R_2$ and capacitor $C_2$ are provided for each block that is formed of a plurality of HBTs arranged so that the thermal resistance difference can be decreased. Therefore, the freedom of element arrangement can be increased. In addition, the decrease of the total number of resistive and capacitance elements acts to reduce the area of the separation region between the elements. Moreover, since the resistor $R_2$ and capacitor $C_2$ are provided for each block that is formed of a plurality of HBTs, not only the area can be reduced, but the capacitor can be used as a discrete capacitor which increases the freedom.

The phrase, "arranged so that the thermal resistance difference can be decreased" in this embodiment means that the thermal resistance between the elements is about ⅕ the total thermal resistance over all the elements or below. In this case, it was experimentally found that if the ratio between the resultant resistance of N parallel resistors $R_1$ and the resistance of resistor $R_2$ was about twice the ratio between the thermal resistance difference of elements and the total thermal resistance over all elements, the thermal stability could be achieved. For example, when the thermal resistance over all elements was 20° C./W and when the thermal resistance difference between elements was 2° C./W, thermal stability could be attained under the connection of the parallel resistance, ~2 ohms of $R_{1A} \sim R_{1N}$ and $R_2$=8 ohms. When 100 transistors, first resistors $R_{1A}$=$R_{1N}$= 200Ω, and only second resistor $R_2$=8Ω were used, the element area could be reduced to 60% of the case of embodiment 1 in which 100 resistors of $R_{2A}$=$R_{2N}$=800Ω were used.

In this embodiment, since the one ends of the first resistors $R_{1A} \sim R_{1N}$ are connected to one node on the input terminal side, the resistor $R_2$ and capacitor $C_2$ are not necessary to be integrated together with the transistors, but resistor $R_2$ and capacitor $C_1$ can be mounted on the substrate out of the transistor chip.

In this case, the transistor chip area can be greatly reduced to 40% of that of embodiment 1.

While the embodiments of the invention have been described in detail, the present invention is not limited to the above embodiments, but may be changed and modified differently without departing from the scope of the invention. For example, although the semiconductor amplifier element in the embodiments was HBT, it can be replaced by silicon bipolar transistors with the same effect. The present invention can be applied at least to the high-frequency amplification technology.

Typical effects of the above-mentioned embodiments will be briefly described below.

(1) The invention can provide a radio communication apparatus capable of suppressing thermal runaway, having a high efficiency and causing almost no oscillation phenomenon.

(2) Since the capacitance values of capacitors used can be reduced, the semiconductor chip (semiconductor device) can be small-sized, and the production cost can be reduced.

(3) The stability and efficiency of the radio communication apparatus can be improved by connecting inductors to the base and emitter terminals.

(4) The bias controllability can be enhanced by use of current mirror configuration.

What is claimed is:

1. A radio communication apparatus having a high-frequency power amplifier module at a transmitter-side output stage, and an antenna connected to said high-frequency power amplifier module, said high-frequency power amplifier module comprising:

an input terminal;

an output terminal;

a control terminal;

a first voltage terminal;

a second voltage terminal;

a power amplifier formed by connecting a plurality of transistors in parallel each of which has a first terminal, a second terminal and a control terminal for controlling a current flowing between said first and second terminals;

first capacitors and first resistors connected in series between said input terminal and said control terminals of said transistors so that said capacitors are connected on said input terminal side while said resistors are connected on said control terminals side; and second resistors connected between said control terminal and the nodes of said first capacitors and said first resistors that are connected to said control terminals of said transistors, wherein said output terminal is connected to said first terminals of said transistors, said first voltage terminal to said first terminals of said transistors, and said second voltage terminal to said second terminals of said transistors.

2. A radio communication apparatus having a high-frequency power amplifier module at a transmitter-side output stage, and an antenna connected to said high-frequency power amplifier module, said high-frequency power amplifier module comprising:

an input terminal;
an output terminal;
a control terminal;
a first voltage terminal;
a second voltage terminal;
a power amplifier formed by connecting a plurality of transistors in parallel each of which has a first terminal, a second terminal and a control terminal for controlling a current flowing between said first and second terminals;
first capacitors and first resistors connected in series between said input terminal and said control terminals of said transistors so that said capacitors are connected on said input terminal side while said resistors are connected on said control terminals side;
second capacitors connected in parallel with said first resistors; and
second resistors connected between said control terminal and the nodes of said first capacitors and said first resistors that are connected to said control terminals of said transistors,
wherein said output terminal is connected to said first terminals of said transistors, said first voltage terminal to said first terminals of said transistors, and said second voltage terminal to said second terminals of said transistors.

3. A radio communication apparatus according to claim 2, wherein the DC voltage drop across each of said transistors in operation is about 0.15 V or below, the resistance value of each of said first resistors is about 1 Ω or below and the capacitance value of each of said second capacitors is about 5 pF or below.

4. A radio communication apparatus according to claim 1, wherein said high-frequency power amplifier module is of a multi-stage arrangement in which a plurality of said power amplifiers are sequentially connected in cascade, so that
said control terminals of said transistors of a first-stage one of said power amplifiers are connected to said input terminal,
said first terminals of said transistors of a last-stage one of said power amplifiers are connected to said output terminal,
said control terminals of said transistors of an intermediate-stage one of said power amplifiers are connected to said first terminals of said transistors of the previous-stage one of said power amplifiers, said first terminals being connected to said control terminals of said transistors of the following-stage one of said power amplifiers,
at least one of said first-stage, intermediate-stage and last-stage power amplifiers has said first capacitors, said first resistors and said second resistors incorporated therein, and
a predetermined control voltage is supplied to said control terminals of said power amplifiers.

5. A radio communication apparatus according to claim 2, wherein said high-frequency power amplifier module is of a multi-stage arrangement in which a plurality of said power amplifiers are sequentially connected in cascade, so that
said control terminals of said transistors of a first-stage one of said power amplifiers are connected to said input terminal,
said first terminals of said transistors of a last-stage one of said power amplifiers are connected to said output terminal,
said control terminals of said transistors of an intermediate-stage one of said power amplifiers are connected to said first terminals of said transistors of the previous-stage one of said power amplifiers, said first terminals being connected to said control terminals of said transistors of the following-stage one of said power amplifiers,
at least one of said first-stage, intermediate-stage and last-stage power amplifiers has said first capacitors, said first resistors and said second resistors and said second capacitors incorporated therein, and
a predetermined control voltage is supplied to said control terminals of said power amplifiers.

6. A radio communication apparatus according to claim 1, wherein inductors are respectively connected between said control terminal and said second resistors.

7. A radio communication apparatus according to claim 1, wherein inductors are respectively connected between said second voltage terminal and said second terminals.

8. A radio communication apparatus according to claim 1, wherein said transistors constituting said power amplifier are monolithically formed on a single semiconductor substrate.

9. A radio communication apparatus according to claim 8, wherein a sensor transistor constituting a current-mirror circuit is monolithically formed on said semiconductor substrate.

10. A radio communication apparatus according to claim 8, wherein a sensor diode constituting a current-mirror circuit is monolithically formed on said semiconductor substrate.

11. A radio communication apparatus having a high-frequency power amplifier module at a transmitter-side output stage, and an antenna connected to said high-frequency power amplifier module, said high-frequency power amplifier module comprising:

an input terminal;
an output terminal;
a control terminal;
a first voltage terminal;
a second voltage terminal;
a power amplifier formed by connecting a plurality of transistors in parallel each of which has a first terminal, a second terminal and a control terminal for controlling a current flowing between said first and second terminals;
a single second capacitor and first resistors connected in series between said input terminal and said control terminals of said transistors so that said capacitor is connected on said input terminal side while said resistors are connected on said control terminals side; and
a single second resistor having one end connected in series with each of said first resistors and the other end connected to said control terminal,
wherein said output terminal is connected to said first terminals of said transistors, said first voltage terminal to said first terminals of said transistors, and said second voltage terminal to said second terminals of said transistors.

12. A radio communication apparatus according to claim 11, wherein one block or a plurality of blocks each of which is formed of a plurality of transistors that constitute said power amplifier are arranged, and said first capacitor and said second resistor are provided for each block.

13. A radio communication apparatus according to claim 12, wherein the thermal resistance difference between the transistors within each block is smaller than the thermal resistance of said power amplifier.

14. A radio communication apparatus according to claim 13, wherein the ratio of the thermal resistance of said power amplifier to the thermal resistance difference between the transistors within each block is equal to or less than about ½ the ratio of the sum of said second resistance and the parallel resistance of said first resistors to the parallel resistance of said first resistors connected in parallel within each block.

15. A semiconductor device comprising:
   an input terminal;
   an output terminal;
   a bias terminal;
   a power amplifier formed by connecting a plurality of transistors each having a first terminal, a second terminal and a control terminal for controlling the current flowing between said first terminal and said second terminal;
   first capacitors $C_{2A} \sim C_{2N}$ connected between said input terminal and said control terminals of said transistors and connected to said input terminal, and first resistors $R_{1A} \sim R_{1N}$ connected in series with said first capacitors $C_{2A} \sim C_{2N}$, and connected to said control terminals of said transistors; and
   second resistors $R_{2A} \sim R_{2N}$ connected between said bias terminal and said control terminals of said transistors, and connected to the nodes of said first resistors $R_{1A} \sim R_{1N}$ and said first capacitors $C_{2A} \sim C_{2N}$, said output terminal being connected to said first terminals of said transistors.

16. A semiconductor device according to claim 15, wherein second capacitors $C_{1A} \sim C_{1N}$ are provided to be connected in parallel with said first resistors $R_{1A} \sim R_{1N}$.

17. A semiconductor device comprising:
   the terminal;
   an output terminal;
   a bias terminal;
   a power amplifier formed by connecting a plurality of transistors each having a first terminal, a second terminal and a control terminal for controlling the current flowing between said first terminal and said second terminal;
   a single first capacitor $C_2$ connected between said input terminal and said control terminals of said transistors and connected to said input terminal, and first resistors $R_{1A} \sim R_{1N}$ connected in series with said first capacitor $C_2$, and connected to said control terminals of said transistors; and
   a single second resistor $R_2$ connected between said bias terminal and said control terminals of said transistors, and connected to the nodes of said first resistors $R_{1A} \sim R_{1N}$ and said first capacitor $C_2$, said output terminal being connected to said first terminals of said transistors.

18. A semiconductor device according to claim 17, wherein second capacitors $C_{1A} \sim C_{1N}$ are provided to be connected in parallel with said first resistors $R_{1A} \sim R_{1N}$.

19. A semiconductor device according to claim 15, wherein the DC voltage drop across each of said transistors in operation is about 0.15 V or below, the resistance value of each of said first resistors is about 1 Ω or below and the capacitance value of each of said second capacitors is about 5 pF or below.

20. A semiconductor device according to claim 15, wherein a sensor transistor constituting a current-mirror circuit is monolithically formed on said semiconductor substrate in which said semiconductor device is formed.

21. A semiconductor device according to claim 15, wherein one block or a plurality of blocks each of which is formed of a plurality of transistors that constitute said power amplifier are arranged, and said first capacitor and said second resistor are provided for each block.

22. A semiconductor device according to claim 21, wherein the thermal resistance difference between the transistors within each block is smaller than the thermal resistance of said power amplifier.

23. A semiconductor device according to claim 21, wherein the ratio of the thermal resistance of said power amplifier to the thermal resistance difference between the transistors within each block is equal to or less than about ½ the ratio of the sum of said second resistance and the parallel resistance of said first resistors to the parallel resistance of said first resistors connected in parallel within each block.

* * * * *